US010917092B2

(12) United States Patent
Romero (10) Patent No.: US 10,917,092 B2
(45) Date of Patent: Feb. 9, 2021

(54) MAGNETIC FIELD SENSOR WITH SWITCHING NETWORK (71) Applicant: Allegro MicroSystems, LLC, Manchester, NH (US)

(72) Inventor: Hernán D. Romero, Buenos Aires (AR)

(73) Assignee: Allegro MicroSystems, LLC, Manchester, NH (US)

( * ) Notice: Subject to any disclaimer, the term of this patent is extended or adjusted under 35 U.S.C. 154(b) by 222 days.

(21) Appl. No.: 15/947,251

(22) Filed: Apr. 6, 2018

(65) Prior Publication Data

US 2019/0312579 A1 Oct. 10, 2019

(51) Int. Cl.
*H03K 17/97* (2006.01)
*G01D 5/14* (2006.01)
*G01R 33/07* (2006.01)

(52) U.S. Cl.
CPC ............. *H03K 17/97* (2013.01); *G01D 5/142* (2013.01); *G01R 33/077* (2013.01)

(58) Field of Classification Search
CPC .. H02J 1/00; H01F 1/00; G06Q 10/00; G06Q 2220/00; H01L 21/00; H01L 2221/00; G01R 1/00
See application file for complete search history.

(56) References Cited

U.S. PATENT DOCUMENTS 2,550,688 A * 5/1951 Gossick ................. G01V 3/107
324/243
7,705,586 B2 4/2010 Van Zon et al.
8,542,010 B2 9/2013 Cesaretti et al.
8,692,546 B2 4/2014 Cesaretti et al.
2003/0094944 A1* 5/2003 Suzuki ................... B82Y 25/00
324/252
2007/0080674 A1* 4/2007 Gray ................... H02M 3/1588
323/282

(Continued)

FOREIGN PATENT DOCUMENTS

EP 1797496 7/2009

OTHER PUBLICATIONS

U.S. Appl. No. 15/606,358, filed May 26, 2017, Latham et al.

(Continued)

*Primary Examiner* — Jermele M Hollington
*Assistant Examiner* — Temilade S Rhodes-Vivour
(74) *Attorney, Agent, or Firm* — Daly, Crowley, Mofford & Durkee, LLP (57) ABSTRACT

A magnetic field sensor comprises a substrate, a first coil supported by the substrate and configured to carry a first current in a first direction to generate a first magnetic field, and a second coil supported by the substrate and nested within the first coil to form a gap between the first and second coils, the second coil configured to carry a second current in a second, opposite direction to generate a second magnetic field. A plurality of magnetic field sensing elements is configured to detect the first and second magnetic fields. A switching network is coupled to the plurality of magnetic field sensing elements and configured to connect the plurality of magnetic field sensing elements to form a first bridge circuit having a first arrangement of the magnetic field sensing elements and a second bridge circuit having a second arrangement of the magnetic field sensing elements.

19 Claims, 8 Drawing Sheets

(56) References Cited

U.S. PATENT DOCUMENTS

| | | | |
|---|---|---|---|
| 2007/0114992 A1* | 5/2007 | Muniraju | G01R 15/207 324/225 |
| 2012/0280341 A1* | 11/2012 | Franke | H01L 24/49 257/427 |
| 2015/0022193 A1 | 1/2015 | Burdette et al. | |
| 2015/0022198 A1 | 1/2015 | David et al. | |
| 2015/0048770 A1* | 2/2015 | Lokere | H02P 31/00 318/504 |
| 2015/0048820 A1* | 2/2015 | Schaffer | G01R 33/04 324/253 |
| 2015/0276816 A1* | 10/2015 | Yoshida | G01R 19/0092 324/244 |
| 2016/0056664 A1* | 2/2016 | Partovi | B60L 53/122 307/104 |
| 2016/0238462 A1* | 8/2016 | Geiger | G01K 13/00 |
| 2016/0273941 A1* | 9/2016 | Hackner | G01D 5/147 |
| 2016/0336760 A1* | 11/2016 | Yamamoto | H02J 50/10 |
| 2017/0016965 A1* | 1/2017 | Chaware | G01R 33/0017 |

OTHER PUBLICATIONS

U.S. Appl. No. 15/606,362, filed May 26, 2017, Latham et al.
U.S. Appl. No. 15/606,332, filed May 26, 2017, Latham et al.
U.S. Appl. No. 15/606,325, filed May 26, 2017, Romero.
U.S. Appl. No. 15/606,352, filed May 26, 2017, Latham et al.
U.S. Appl. No. 15/606,262, filed May 26, 2017, Latham et al.

* cited by examiner

MAGNETIC FIELD SENSOR WITH SWITCHING NETWORK

FIELD

This disclosure relates to magnetic field sensors and, more particularly, to magnetic field sensors with configurable switching networks.

BACKGROUND

Magnetic field sensors are often used to detect a ferromagnetic target. They often act as sensors to detect motion or position of the target. Such sensors are ubiquitous in many areas of technology including robotics, automotive, manufacturing, etc. For example, a magnetic field sensor may be used to detect when a vehicle's wheel locks up, triggering the vehicle's control processor to engage the anti-lock braking system. In this example, the magnetic field sensor may detect rotation of the wheel. Magnetic field sensors may also detect distance to an object. For example, a magnetic field sensor may be used to detect the position of a hydraulic piston.

Magnetic field sensors generally employ one or more magnetic field sensing elements, such as Hall effect elements, magnetoresistors, etc. These elements can be positioned relative to a magnetic field so that they are relatively sensitive or relatively insensitive to the magnetic field. Magnetoresistors can be designed and/or positioned so that their resistance will increase in response to a magnetic field or decrease in response to the magnetic field.

Magnetic field sensing elements can be coupled in bridge arrangements to provide a differential signal, single-ended signal, and/or common mode signal representing a detected magnetic field.

SUMMARY

A magnetic field sensor may include a switching network to couple magnetic field sensing elements to form one or more first bridge circuits. The switching network may also couple the same magnetic field sensors together in a different way to form one or more second bridge circuits. The first bridge circuits and the second bridge circuits may respond in different ways to different magnetic fields having different directions.

In an embodiment, a magnetic field sensor comprises a substrate, a first coil supported by the substrate and configured to carry a first current in a first direction to generate a first magnetic field, and a second coil supported by the substrate and nested within the first coil to form a gap between the first and second coils, the second coil configured to carry a second current in a second, opposite direction to generate a second magnetic field. A plurality of magnetic field sensing elements is configured to detect the first and second magnetic fields. A switching network is coupled to the plurality of magnetic field sensing elements and configured to connect the plurality of magnetic field sensing elements to form a first bridge circuit having a first arrangement of the magnetic field sensing elements and a second bridge circuit having a second arrangement of the magnetic field sensing elements.

In another embodiment, a magnetic field sensor comprises a first coil configured to carry a first current in a first direction to generate a first magnetic field, a second coil configured to carry a second current in a second, opposite direction to generate a second magnetic field, a plurality of magnetic field sensing elements configured to detect the first and second magnetic fields, a switching network coupled to the plurality of magnetic field sensing elements and configured to connect the plurality of magnetic field sensing elements to form a bridge circuit.

In another embodiment, a magnetic field sensor comprises a first coil configured to carry a first current in a first direction to generate a first magnetic field, wherein the first magnetic field induces a reflected field in a conductive target, a second coil configured to carry a second current in a second, opposite direction to generate a second magnetic field, a plurality of magnetic field sensing elements configured to detect the first and second magnetic fields, and means for connecting one or more of the plurality of magnetic field sensing elements to form a bridge circuit.

BRIEF DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more exemplary embodiments. Accordingly, the figures are not intended to limit the scope of the invention. Like numbers in the figures denote like elements.

DETAILED DESCRIPTION

As used herein, the term "magnetic field sensing element" is used to describe a variety of electronic elements that can sense a magnetic field. The magnetic field sensing element can be, but is not limited to, a Hall Effect element, a magnetoresistance element, or a magnetotransistor. As is known, there are different types of Hall Effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the terms "target" and "magnetic target" are used to describe an object to be sensed or detected by a magnetic field sensor or magnetic field sensing element.

Figure 1:
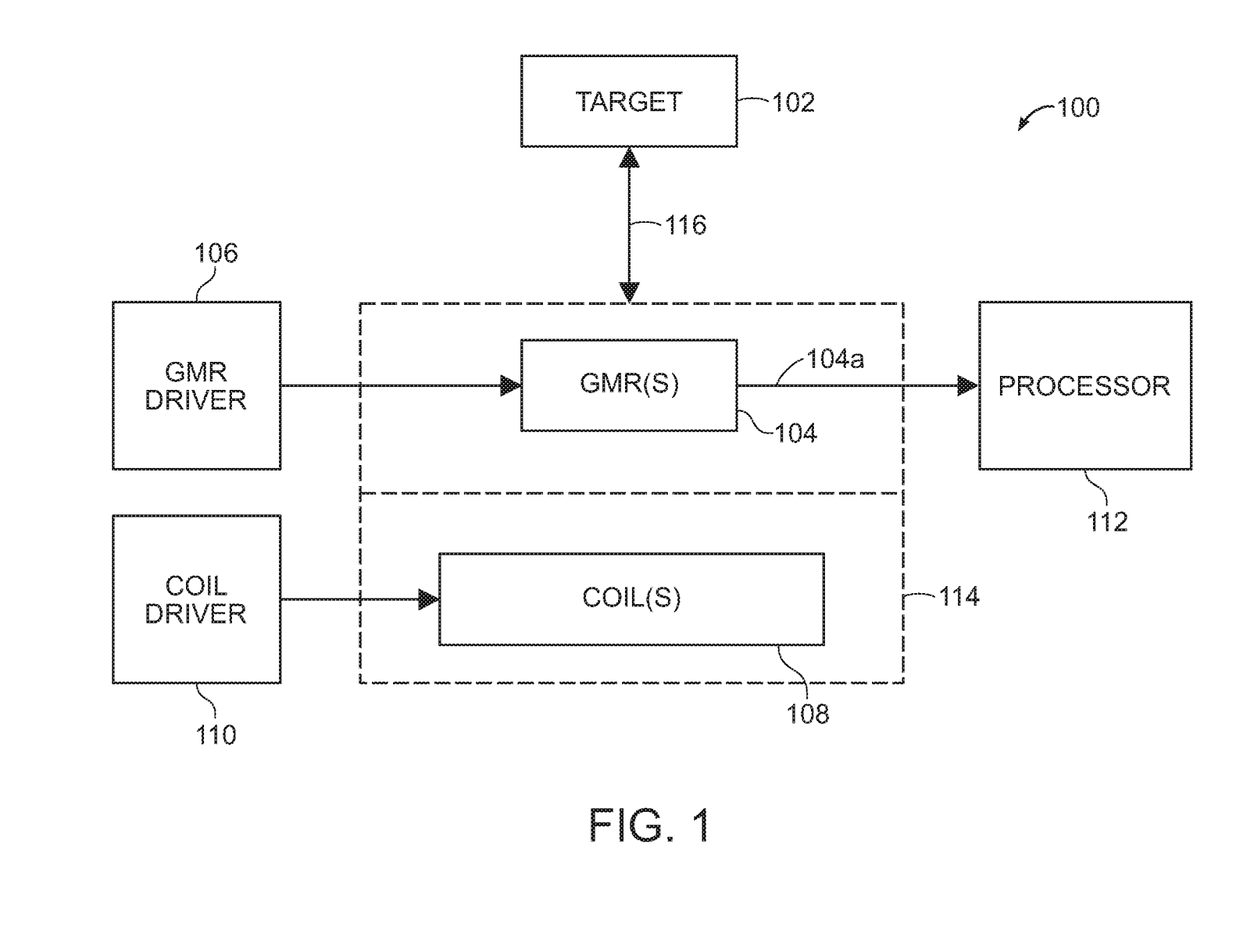
FIG. 1 is a block diagram of an embodiment of a magnetic field sensor.

FIG. 1 is a block diagram of a system 100 for detecting a conductive target 102. Target 102 may be magnetic or non-magnetic in various embodiments. System 100 includes one or more magnetoresistance (MR) elements 104 and an MR driver circuit 106. MR driver circuit may include a power supply or other circuit that provides power to MR elements 104. In embodiments, MR elements 104 may be replaced with other types of magnetic field sensing elements such as Hall effect elements, etc. MR elements 104 may comprise a single MR element or multiple MR elements. The MR elements may be arranged in a bridge configuration, in certain embodiments.

System 100 may also include one or more coils 108 and a coil driver circuit 110. Coils 108 may be electrical coils, windings, wires, traces, etc. configured to generate a magnetic field when current flows through the coils 108. In embodiments, coils 108 comprise two or more coils, each a conductive trace supported by a substrate, such as a semiconductor substrate, a glass substrate, a ceramic substrate, or the like. In other embodiments, coils 108 may not be supported by a substrate. For example, coils 108 may be supported by a chip package, a frame, a PCB, or any other type of structure that can support traces of a coil. In other embodiments, coils 108 may be free standing wire, i.e. not supported by a separate supporting structure.

Coil driver 110 is a power circuit that supplies current to coils 108 to generate the magnetic field. In an embodiment, coil driver 110 may produce an alternating current so that coils 108 produce alternating magnetic fields (i.e. magnetic fields with magnetic moments that change over time). Coil driver 110 may be a circuit implemented, in whole or in part, on the semiconductor die.

System 100 may also include processor 112 coupled to receive signal(s) 104a from MR elements 104, which may represent the magnetic field as detected by MR elements 104. Processor 100 may receive signal 104a and use it to determine a position, speed, direction, or other property of target 102.

MR elements 104 and coils 108 may be positioned on substrate 114. Substrate 114 may comprise semiconductor substrates, such as silicon substrates, a chip package, PCB or other type of board-level substrates, or any type of platform that can support MR elements 104 and coils 108. Substrate 114 may include a single substrate or multiple substrates, as well as a single type of substrate or multiple types of substrates.

In operation, MR driver 106 provides power to MR elements 104 and coil driver 110 provides current to coils 108. In response, coils 108 produce a magnetic field that can be detected by MR elements 104, which produce signal 104a representing the detected magnetic field.

As target 102 moves in relation to the magnetic field, its position and movement through the field changes the field. In response, signal 104a produced by MR elements 104 changes. Processor 112 receives signal 104a and processes the changes in (and/or the state of) the signal to determine position, movement, or other characteristics of target 102. In an embodiment, system 100 can detect movement or position of target 102 along axis 116. In other words, system 100 may detect the position of target 102 in proximity to MR elements 104 as target 102 moves toward or away from MR elements 104 and coils 108. System 100 may also be able to detect other types of position or movement of target 102.

Further examples may be found in U.S. patent application Ser. Nos. 15/606,362; 15/606,332; 15/505,352; 15/606,262; 15/606,358; and 15/606,325 (all filed May 26, 2017), which are incorporated here by reference in their entirety.

Figure 2:
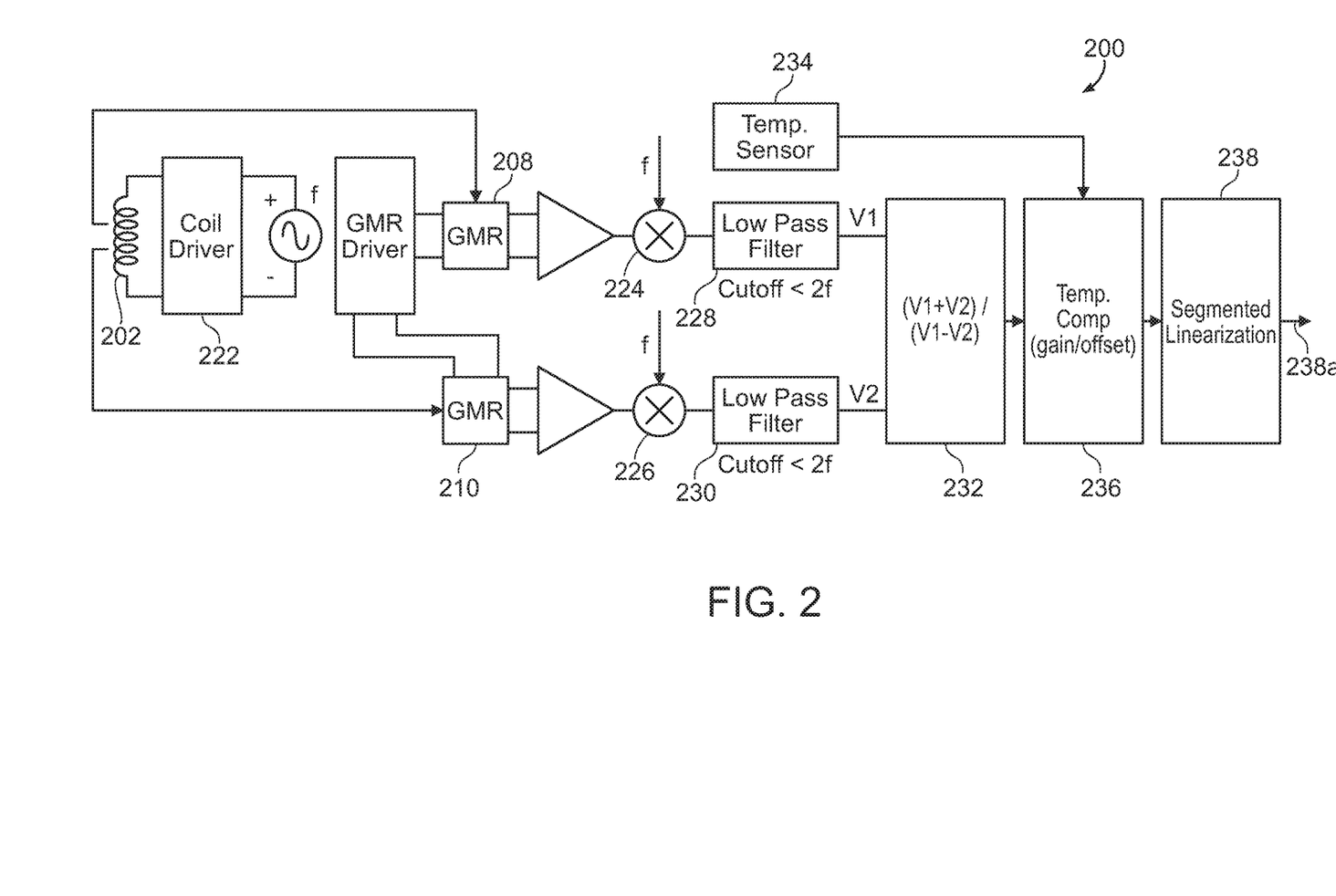
FIG. 2 is a block diagram of an embodiment of a magnetic field sensor.

Referring to FIG. 2, magnetic field sensor 200 may include coil 202, which may be the same as or similar to coil(s) 108, magnetoresistance ("MR") bridge 208, and MR bridge 210. Coil driver 222 may drive coil 202 at frequency f. MR driver 225 may drive one or both MR bridges 208 and 210 at 0 Hz (i.e. DC) or at another frequency.

Demodulator 224 and demodulator 226 may demodulate the output signals from MR bridges 208 and 210, respectively, at frequency f. This may shift the frequency components of the signals at frequency f to 0 Hz or DC, and may shift other frequency components in the signal to higher frequency bands. Low pass filters 228 and 230 may then remove the higher frequency components from the signals and provide a DC signal V1 (corresponding to the magnetic field detected by MR bridge 208) and a DC signal V2 (corresponding to the magnetic field detected by MR bridge 210) to processing block 232.

Processing block 232 may process signals V1 and V2 to produce a signal representing the detected target. In an embodiment, processing block 232 may perform the operation X=(V1+V2)/(V1−V2), where X is the signal representing the detected target. In this embodiment, the position of the MR bridges 208 and 210 are chosen in a way that the first bridge sees a negative signal from the coil (directly coupled field) and the second sees an opposite signal from the coil. Both bridges 208 and 210 may see the same reflected signal from the target. Hence the term V1+V2 may represent the reflected magnetic field from the target and V1−V2 may represent the directly coupled magnetic field. The ratio gives then a quantity X which is independent of the sensitivity change of the MR elements due to the temperature or stray fields for example, as well as variations in coil current. In this embodiment, the position of the MRs (and/or coils) may be chosen so that each MR is seeing (e.g. can detect) a coil signal and a reflected signal of the same range of amplitude i.e. typically a reflected field varying from 0.1% to 100% of the direct detected field.

Other signal processing and mathematical operations may be used in other embodiments to process, filter, separate, or perform other operations on the reflected signal and a directly coupled signal. In some embodiments, the directly coupled signal may be a diagnostic signal.

Sensor 200 may also include a temperature sensor 234 and temperature compensation circuit 236. To maintain accuracy of the sensor's output, temperature compensation circuit 236 may adjust gain, offset, or other signal parameters based on the temperature sensed by temperature sensor 234. Segmented linearization circuit 238 may linearize the output signal to remove any nonlinear response before the signal is provided as output 238a.

One skilled in the art will recognize that the arrangement shown in FIG. 2 is an example of a circuit that may be used in conjunction with the circuits and techniques described in this document, and that other arrangements may also be used. For example, in other embodiments, the MR elements may be arranged in various other configurations and processing block 232 may be replaced with any signal processing circuit capable of determining a position of the target.

Figure 3:
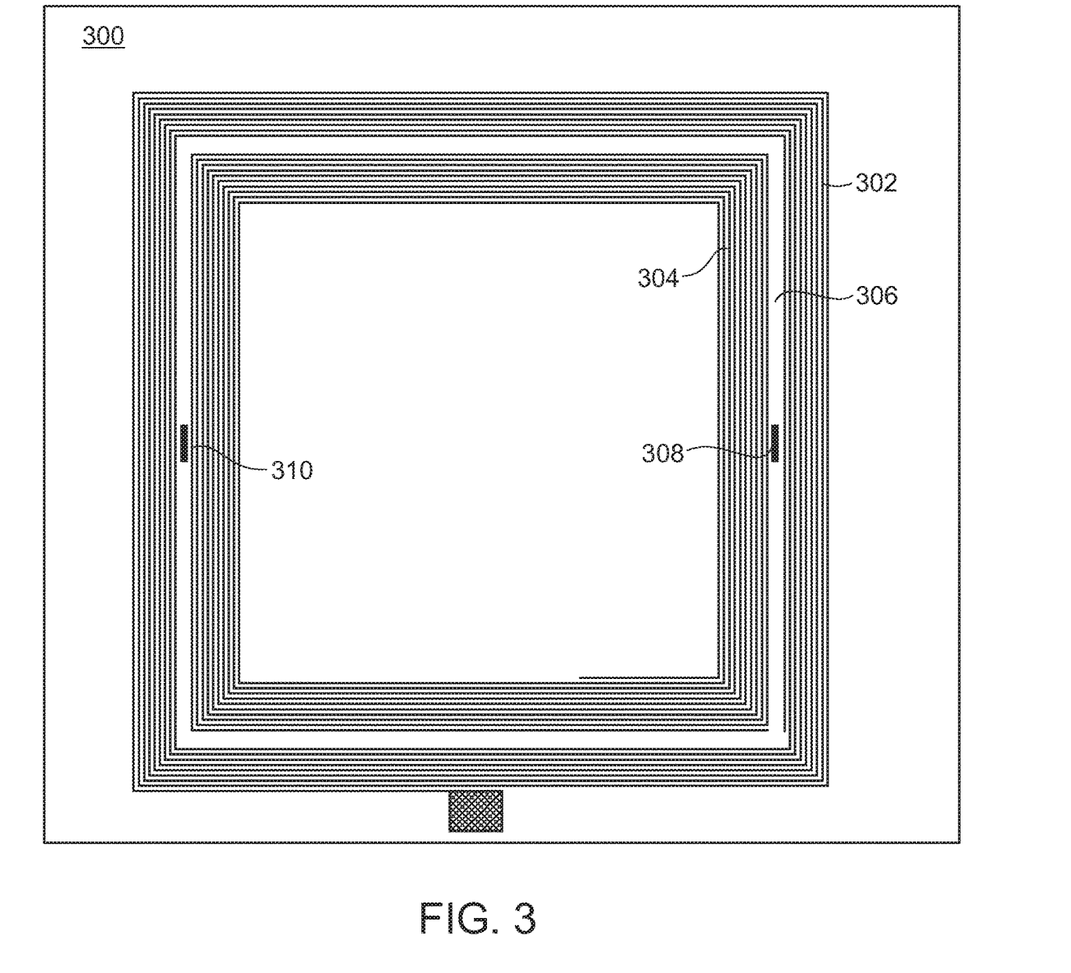
FIG. 3 is a layout diagram of coils and magnetic field sensing elements on a substrate.

FIG. 3 is a layout diagram that provides an example of coils and magnetic field sensing elements laid out on (e.g. supported by) semiconductor substrate 300. Substrate 300 may comprise any material known in the art that can support integrated circuitry including, but not limited to: silicon, silicon oxide, gallium arsenide, a ceramic semiconductor, a glass semiconductor, etc.

Coil 302 may be the same as or similar to coil 202. A second coil 304 may be nested within coil 302 to form a gap 306 between coil 302 and 304. In embodiments, coil 302 and coil 304 may be configured to carry current in opposite directions. For example, current may flow through the windings of coil 302 in a clockwise direction and flow through the windings of coil 304 in a counterclockwise direction. If the current through coils 302 and 304 is an AC current, the direction of current through coil 302 may be opposite to the direction of current through coil 304 in any instantaneous point in time (unless the current is zero). In an embodiment, coils 302 and 304 may be connected in series so that the magnitude of the current through both coils is the same, though the direction of the current through the windings may be opposite.

Magnetic field sensing elements 308 and 310 may be the same as or similar to magnetic field sensing elements 208 and 210. In embodiments, magnetic field sensing element 308 shown in FIG. 3 represents one or more magnetic field sensing elements and magnetic field sensing element 310 represents one or more magnetic field sensing elements.

Figure 4:
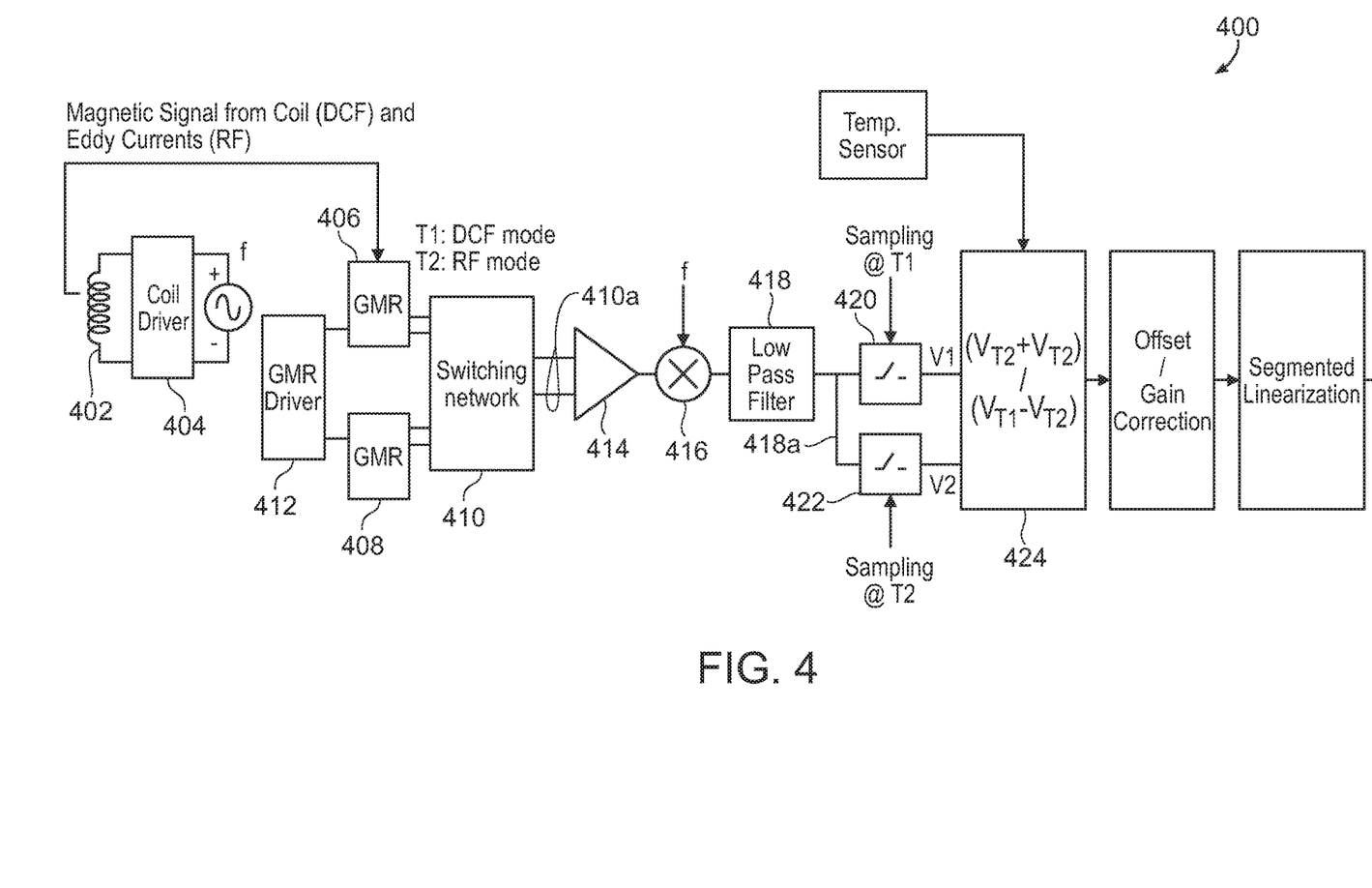
FIG. 4 is a block diagram of an embodiment of a magnetic field sensor including a switching network.

FIG. 4 is a block diagram of a magnetic field sensor 400 which may be similar to magnetic field sensor 200. Magnetic field sensor 400 may include coils 402. Although shown as a single coil, coil 402 may comprise two or more coils which may be the same as or similar to coils 302 and 304 of FIG. 3. Coil driver 404 drives current through coils 402, which may generate a magnetic field.

Magnetic field sensing elements 406 and 408 may be the same as or similar to magnetic field sensing elements 308 and 310. In embodiments, coils 402 may comprise two coils having a gap between them. Magnetic field sensing elements 406 and 408 may be positioned in the gap.

Magnetic field sensor 400 may also include a switching network 410 comprising a plurality of switches coupled to magnetic field sensing elements 406 and 408. In embodiments, magnetic field sensing elements 406 and 408 each represent multiple magnetic field sensing elements that may be connected and disconnected in various arrangements by switching network 410.

An MR driver circuit 412 may be coupled to switching network 410. MR driver circuit 412 may comprise a voltage regulator and/or other circuits to provide power to magnetic field sensing elements 406 and 408. Switching network 410 may selectively provide connections between driver circuit 412 and one or more of the magnetic field sensing elements. These connections may include a power supply line and/or a return line. In other embodiments, driver circuit 412 may be directly coupled to one or more of the magnetic field sensing elements rather than coupled through a switching network. Output signal 410a may represent the output of magnetic field sensing elements 406 and/or 408, which, as will be discussed later, may be arranged and coupled in various configurations by switching network 410.

Magnetic field sensor 400 may include an amplifier 414 to amplify signal 410a. Modulator circuit 416 may modulate the signal at frequency f, which may be the same frequency of coil driver 404, i.e., modulator 416 may modulate the signal at the same frequency as the magnetic field signal produced by coil 402 and detected by magnetic field sensing elements 406 and 408. This may shift the frequency components of the signal that represent the detected magnetic field to a zero or near-zero frequency for subsequent processing. It may also shift other frequency components of the signal to higher frequencies.

Low pass filter 418 may receive modulated signal 416a to remove higher frequency components from the signal. In embodiments, filter 418 may be configured to filter noise and other signal components while passing the frequency components of signal 416a that represent the detected magnetic field.

Sensor 400 may also include sampling circuits 420 and 422. Sampling circuit 420 may sample signal 418a during a time period T1, and sampling circuit 422 may sample signal 418a during a time-period T2. In embodiments, time periods T1 and T2 are non-overlapping time periods. In embodiments, switching network 410 may selectively couple magnetic MR elements 406 and 408 in a first arrangement during time period T1 and couple MR elements 406 and 408 in a second arrangement during time period T2 so that signal 418a represents V1 during time period T1 and represents V2 during time period T2.

Processing block 424 may process signals V1 (received during time period T1) and V2 (received during time period T2) to produce a signal representing the detected target. In an embodiment, processing block 424 may perform the operation $X=(V1+V2)/(V1-V2)$, where X is the signal representing the detected target. In this embodiment, MR elements 406 and 408 are coupled by switching network 410 so that the first bridge sees a negative signal from the coil (directly coupled field) and the second sees an opposite signal from the coil. Switching network 410 may also couple MR elements 406 and 408 so they detect the same reflected signal from the target. Hence the term $V1+V2$ may represent the reflected magnetic field from the target and $V1-V2$ may represent the directly coupled magnetic field. The ratio gives then a quantity X which is independent of the sensitivity change of the MR elements due to the temperature or stray fields for example, as well as variations in coil current. In this embodiment, the position of the MRs (and/or coils) may be chosen so that each MR is seeing (e.g. can detect) a coil signal and a reflected signal of the same range of amplitude i.e. typically a reflected field varying from 0.1% to 100% of the direct detected field.

Figure 5:
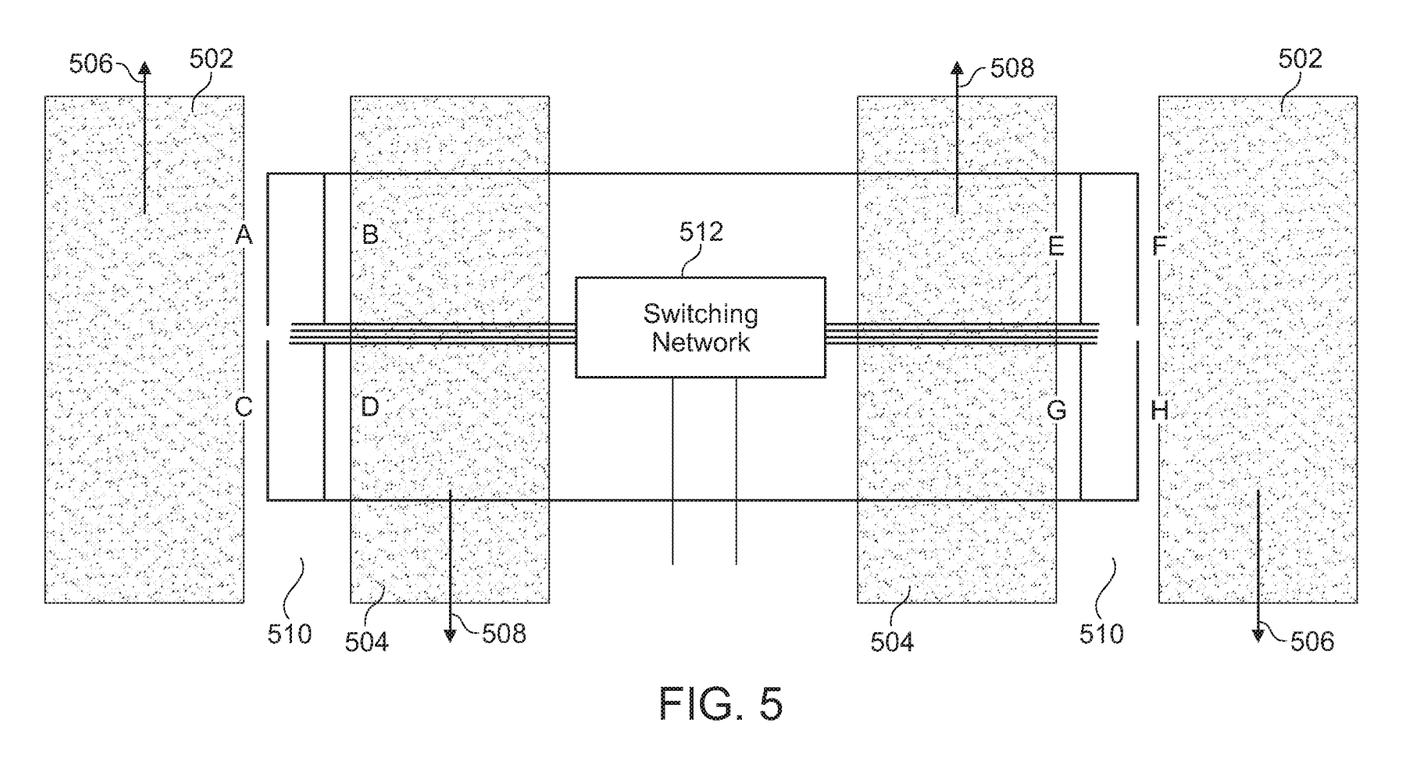
FIG. 5 is a layout diagram of coils and magnetic field sensing elements on a substrate including a switching network.

FIG. 5 is a layout diagram of a first coil 502 and a second coil 504 nested within coil 502. The current though coils 502 and 504 may flow in opposite directions. In the example shown in FIG. 5, current though coil 502 may flow in a clockwise direction (as indicated by arrows 506) and current through coil 504 may flow in a counterclockwise direction (as indicated by arrows 508). Coils 502 and 504 may be the same as or similar to coils 302 and 304 (see FIG. 3).

Magnetic field sensing elements A-H may be positioned within gap 510 between the coils. Magnetic field sensing elements A-H may comprise magnetoresistance elements, Hall effect elements, or any other type of magnetic field sensing elements.

In embodiments, coil 502 may be a counter-coil or counter turn of coil 504. In other words, coil 502 may comprise one or more coils of coil 504 that wind in the opposite direction of coil 504. For example, if coil 504 is laid out on a substrate in a clockwise winding pattern, one or more coils of 504 which are local to (i.e. adjacent to) the magnetic field sensing elements may be laid out in a counterclockwise winding pattern. In this case, the counterclockwise windings may be considered counter-coils or counter-turns of coil 504. The counter-turn may be placed asymmetrically with respect to the MR elements A-H. This may result in the same directly-coupled field detected by the MR elements on either side of the coils.

Switching network 512 may include transistors or other switches that can couple magnetic field sensing elements A-H together in various arrangements. Switching network 512 may the same as or similar to switching network 410 (FIG. 4).

Figure 6:
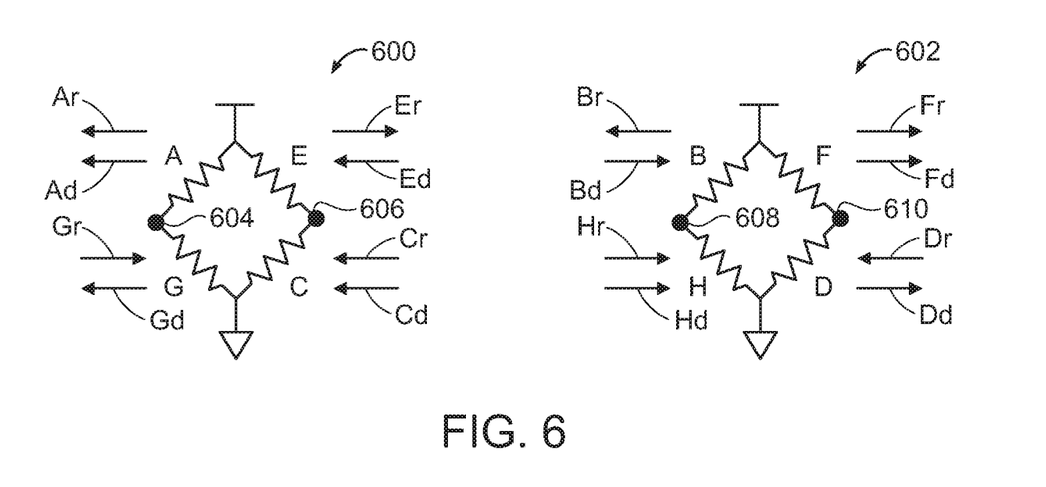
FIG. 6 is a circuit diagram of magnetic field sensing elements coupled in a bridge arrangement.

Referring to FIG. 6, switching network 512 may connect magnetic field sensing elements A, C, E, and G together to form a first bridge circuit 600, and may connect magnetic field sensing elements B, D, F, and H together to form a second bridge circuit 602. In embodiments, this arrangement may be used to differentially sense the reflected field.

Arrows Ar, Br, Cr, Dr, Er, Fr, Gr, and Hr represent the reflected field as detected by each respective magnetic field sensing element A-H. Similarly, Arrows Ad, Bd, Cd, Dd, Ed, Fd, Gd, and Hd represent the directly coupled field as detected by each magnetic field sensing element A-H.

In bridge 600, arrows Ar and Cr representing the reflected field point to the left while arrows Er and Gr point to the right. This indicates that the respective magnetic field sensing elements are positioned so that, as the reflected field increases in strength (or changes direction, or both), the resistance of MR elements A and C will increase, and the resistance of MR elements E and G will decrease. As a result, the voltage at node 604 will decrease and the voltage at node 606 will increase. As the reflected field decreases in strength, the opposite will occur: the resistance of MR elements A and C will decrease, and the resistance of MR elements E and G will increase. As a result, the voltage at node 604 will increase and the voltage at node 606 will decrease. In this way, nodes 604 and 606 provide a differential voltage that changes in response to changes in the reflected magnetic field.

Also, arrows Ad, Ed, Gd, and Cd representing the directly coupled field all point to the left. This indicates that the respective magnetic field sensing elements are positioned so that, as the directly coupled field increases in strength (or changes direction, or both), the resistance of all four magnetic field sensing elements A, E, G, and C will increase and, as the directly coupled field decreases in strength, the resistance of all four magnetic field sensing elements A, E, G, and C will decrease. Because all four magnetic field sensing elements have the same reaction to the directly coupled field, and because the MR elements form voltage divider circuits (e.g. node 604 is a central node in a voltage divider formed by MR elements A and G), the voltage at nodes 604 and 606 will not change as the directly coupled field changes. Thus, in this configuration, bridge 600 (i.e. the output voltage across nodes 604 and 606) will be responsive (e.g. provide a differential output) to changes in the reflected field, and substantially unresponsive to changes in in the directly coupled field.

One skilled in the art will note that, with respect to bridge 602, arrows Br and Dr representing the reflected field point to the left, and arrows Hr and Fr representing the reflected field point to the right, while arrows Bd, Fd, Hd, and Dd representing the directly coupled field all point to the right. Thus, bridge 602 (i.e. the output voltage across nodes 608 and 610) is also configured to react (e.g. provide a differential output) to changes in the reflected field and to remain substantially unreactive to changes in the directly coupled field.

Figure 7:
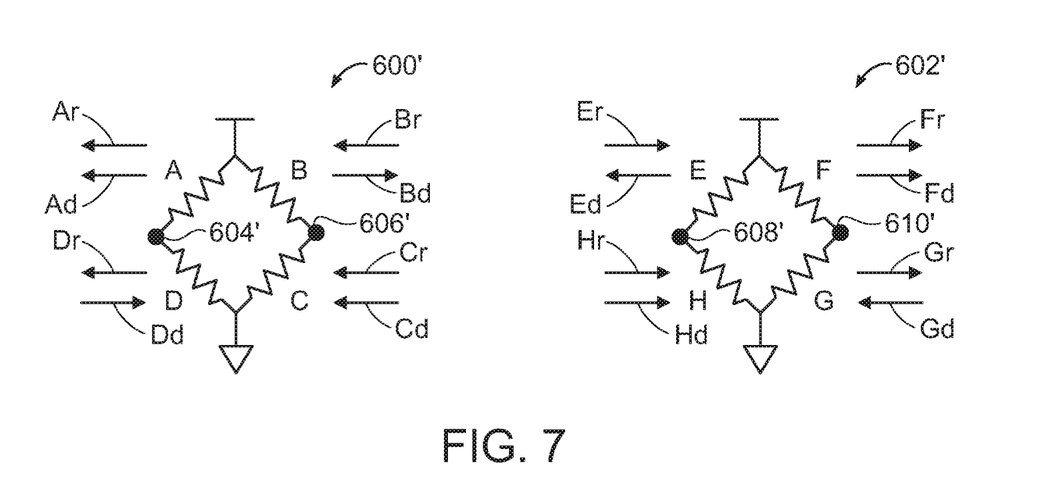
FIG. 7 is a circuit diagram of magnetic field sensing elements coupled in a different bridge arrangement.

Referring to FIG. 7, switching network 512 may couple the magnetic field sensing elements A-H to form bridges 600' and 602' to be reactive to the directly coupled field and relatively unreactive to changes in the reflected field. In this instance, bridge 600' is coupled to include magnetic field sensing elements A, B, C, and D; and bridge 602' is coupled to include magnetic field sensing elements E, F, G, and H.

With regard to bridge 600', arrows Ar, Br, Cr, and Dr, representing the reflected field all point left. This indicates that the respective magnetic field sensing elements are positioned so that, as the reflected field increases in strength (or changes direction, or both), the resistance of all four magnetic field sensing elements A, B, C, and D will increase and, as the reflected field decreases in strength the resistance of all four magnetic field sensing elements A, B, C, and D will decrease. Because all four magnetic field sensing elements have the same reaction to the reflected field, the voltage at nodes 604' and 606' will not change as the reflected field changes.

Also, arrows Ad and Cd representing the reflected field point to the left while arrows Bd and Dd point to the right. This indicates that the respective magnetic field sensing elements are positioned so that, as the directly coupled field increases in strength (or changes direction, or both), the resistance of MR elements A and C will increase, and the resistance of MR elements B and D will decrease. As a result, the voltage at node 604' will decrease and the voltage at node 606' will increase. As the directly coupled field decreases in strength, the opposite will occur: the resistance of MR elements A and C will decrease, and the resistance of MR elements B and D will increase. As a result, the voltage at node 604' will increase and the voltage at node 606' will decrease. In this way, nodes 604' and 606' provide a differential voltage that changes in response to changes in the directly coupled field.

Thus, in this configuration, bridge 600' (i.e. the output voltage across nodes 604' and 606') will be reactive (e.g. provide a differential output) to changes in the directly coupled field, and substantially unreactive to changes in the reflected field.

One skilled in the art will note that, with respect to bridge 602', arrows Ed and Gd representing the directly coupled field point to the left, and arrows Fd and Hd representing the directly coupled field point to the right, while arrows Er, Fr, Gr, and Hr representing the reflected field all point to the right. Thus, bridge 602' (i.e. the output voltage across nodes 608' and 610') is also configured to react (e.g. provide a differential output) to changes in the directly coupled field and to remain substantially unreactive to changes in the reflected field.

In embodiments, switching network 512 may couple magnetic field sensing elements A-H to form bridges 600 and 602 during a first time period, and may couple magnetic field sensing elements A-H to form bridges 600' and 602' during a second time period. The first and second time periods may be non-overlapping time periods. As a result, during the first time period, the magnetic field sensor may be configured to detect and react to changes in the reflected magnetic field and be substantially unresponsive to changes in the directly coupled field, and during the second time period, the magnetic field sensor may be configured to detect and react to changes in the directly coupled field and be substantially unresponsive to changes in the reflected field. Referring again to FIG. 4, sampling circuit 420 may sample the signal representing the reflected field (as detected by bridges 600 and 602) during the first time period and sampling circuit 422 may sample the signal representing the directly coupled field (as detected by bridges 600' and 602') during the second time period.

Having sampled both magnetic fields, magnetic field sensor 400 may then process both signals to determine position of the target, determine and compensate for sensitivity of the magnetic field sensor, test the signal path of the sensor for errors, etc. For example, sampling circuit may use the reflected field (detected by bridges 600 and 602) to determine a state of the target (position, speed, direction of rotation, etc.). Also, because the directly coupled field may have an expected value, magnetic field sensor 400 may measure the directly coupled field to determine if it matches the expected value. If it does not match the expected value, magnetic field sensor 400 may adjust the sensitivity of the magnetic field sensing elements (by adjusting the supply voltage, signal amplification, signal filtering, etc.). Additionally or alternatively, if the measurement of the directly coupled field does not match the expected value, magnetic field sensor 400 may generate an error signal indicating a potential malfunction.

Figure 8:
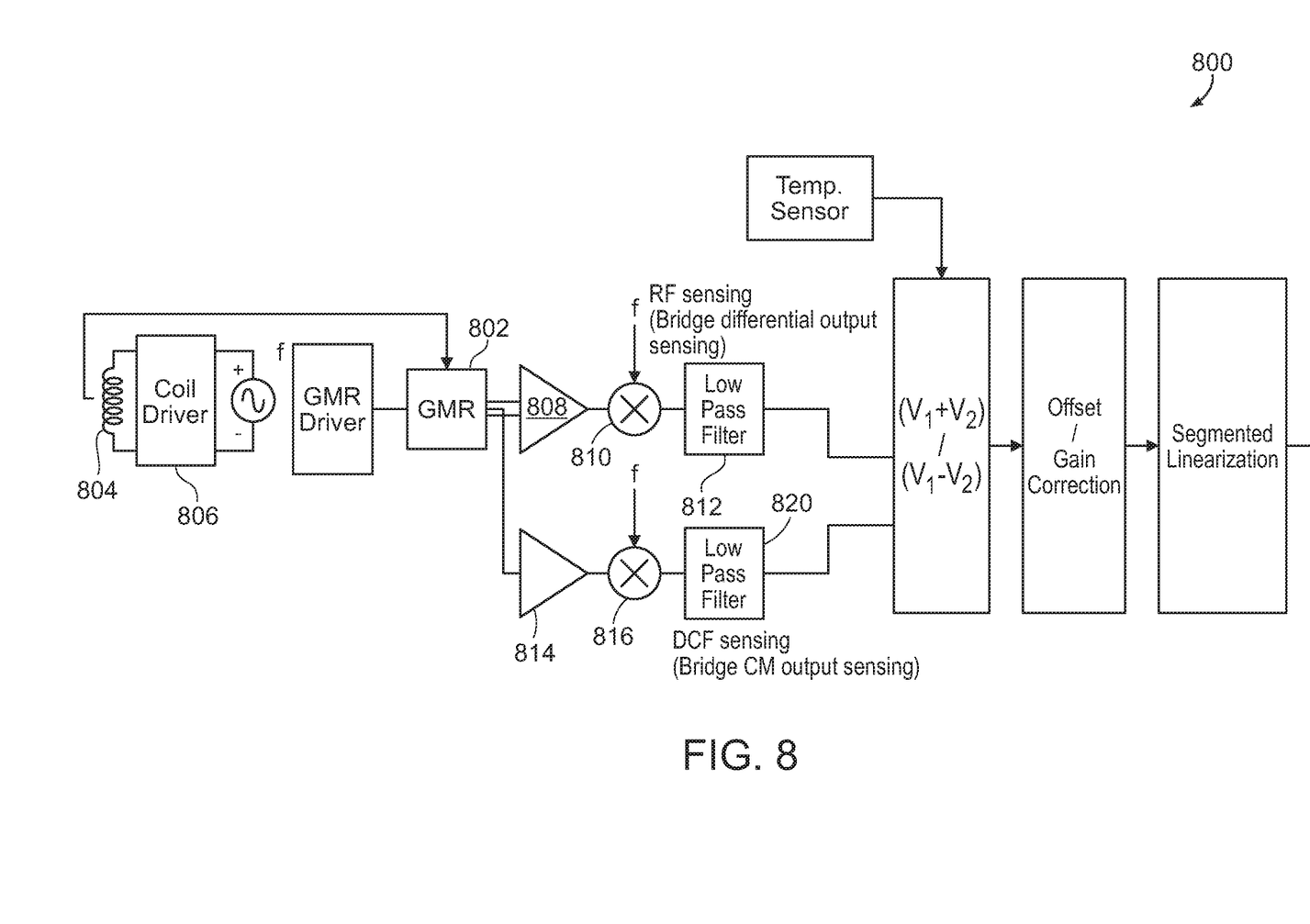
FIG. 8 is a block diagram of an embodiment of a magnetic field sensor.

Referring to FIG. 8, magnetic field sensor 800 may be configured to detect the reflected field using a differential signal provided by MR bridge 802 and detect the directly coupled field using a common mode signal provided by MR bridge 802 (or vice versa). Magnetic field sensor 800 may include coil(s) 804 and coil driver 806, which may be the same as or similar to coil(s) 402 and coil driver 404. In embodiments, coil(s) 804 may comprise a first coil and a second coil nested within the first coil, like coils 502 and 504 (see FIG. 5).

MR element(s) 802 may comprise a plurality of magnetic field sensing elements arranged in a bridge. Amplifier 808 may be a differential amplifier. Modulator 810 and low pass filter 812 may receive and process a differential signal from MR elements 802. Amplifier 814 may be a single-ended amplifier. In other embodiments, amplifier 814 may be a differential amplifier with one input coupled to a common mode reference. Modulator 816, and low-pass filter 820 may receive and process a single-ended signal (e.g. the bridge's output common mode signal) from MR elements 802. Processing block 822 may be the same as or similar to processing blocks 232, 424 (see FIG. 2, 4).

Figure 9:
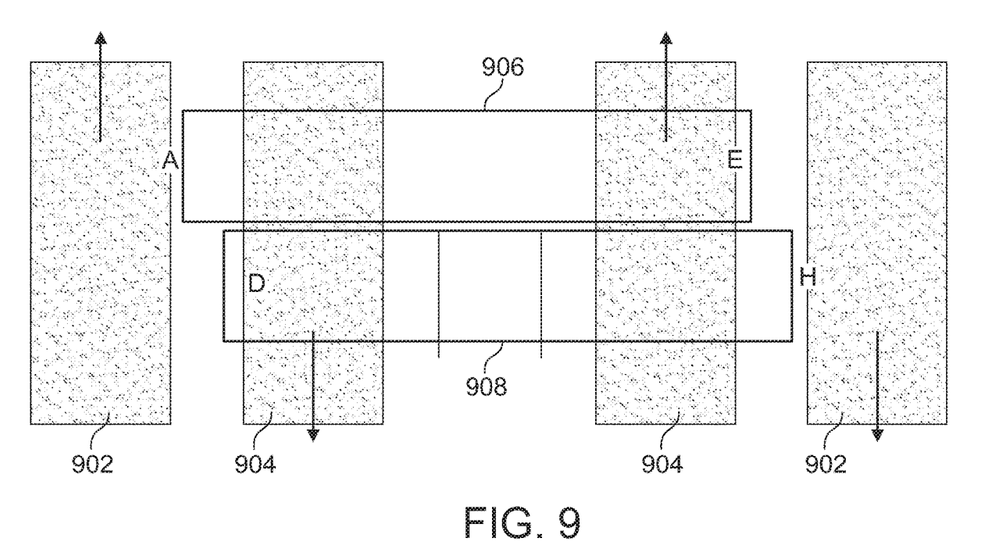
FIG. 9 is a layout diagram of coils and magnetic field sensing elements.
Figure 10:
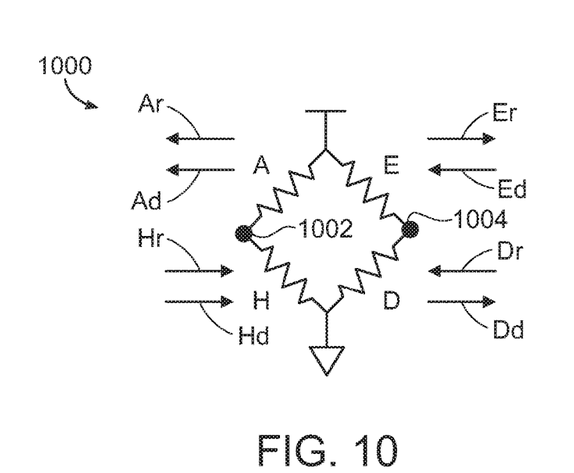
FIG. 10 is a circuit diagram of magnetic field sensing elements coupled in a bridge arrangement.

Referring also to FIG. 9 and FIG. 10, MR elements 802 may be arranged in a bridge configuration. In an embodiment, the bridge may be bridge 1000 including MR elements A, E, H, and D, as shown in FIG. 9 and FIG. 10. FIG. 9 illustrates a layout of coils 902 and 904 along with MR elements A, E, H, and D. Coils 902 and 904 may be the same as or similar to coils 502 and 504 (see FIG. 5). Rectangle 906 indicates that MR elements A and E may form a top part of bridge 1000 and rectangle 908 indicates that MR elements D and H may form a bottom part of bridge 1000.

In bridge 1000, arrows Ar and Dr representing the reflected field point to the left while arrows Er and Hr point to the right. This indicates that the respective magnetic field sensing elements are positioned so that, as the reflected field increases in strength (or changes direction, or both), the resistance of MR elements A and D will increase, and the resistance of MR elements E and H will decrease. As a result, the voltage at node 1002 will decrease and the voltage at node 1004 will increase. As the reflected field decreases in strength, the opposite will occur: the resistance of MR elements A and D will decrease, and the resistance of MR elements E and H will increase. As a result, the voltage at node 1002 will increase and the voltage at node 1004 will decrease. In this way, nodes 1002 and 1004 provide a differential voltage that changes in response to changes in the reflected magnetic field.

Arrows Ad and Ed representing the directly coupled field point to the left while arrows Hd and Dd point to the right. This indicates that the respective magnetic field sensing elements are positioned so that, as the directly coupled field increases in strength (or changes direction, or both), the resistance of MR elements A and E will increase, and the resistance of MR elements D and H will decrease. As a result, the voltage at both nodes 1002 and 1004 will decrease. As the reflected field decreases in strength, the opposite will occur: the resistance of MR elements A and E will decrease, and the resistance of MR elements D and H will increase. As a result, the voltage at both nodes 1002 and 1004 will increase. In this way, nodes 1002 and 1004 each provide a common mode voltage output that changes in response to changes in the directly coupled field. One skilled in the art will recognize that bridge 1000 may also be formed so that the differential output at nodes 1002 and 1004 represents the directly coupled field and the common mode output represents the reflected field.

In embodiments, the differential inputs of differential amplifier 808 may be coupled to nodes 1002 and 1004. Also, where amplifier 814 is a differential amplifier, one input of amplifier 814 may be coupled to receive an average of the voltages at nodes 1002 and 1004 and the other input may be coupled to receive a common mode reference voltage.

Having described preferred embodiments, which serve to illustrate various concepts, structures and techniques, which are the subject of this patent, it will now become apparent to those of ordinary skill in the art that other embodiments incorporating these concepts, structures and techniques may be used. Accordingly, it is submitted that that scope of the patent should not be limited to the described embodiments but rather should be limited only by the spirit and scope of the following claims. All references cited in this patent are incorporated here by reference in their entirety.

The invention claimed is:
1. A magnetic field sensor comprising:
a substrate;

a first coil supported by the substrate and configured to carry a first current in a first direction to generate a first magnetic field;

a second coil, supported by the substrate and nested within the first coil to form a gap between the first and second coils, the second coil configured to carry a second current in a second, opposite direction to generate a second magnetic field;

a plurality of magnetic field sensing elements configured to detect the first and second magnetic fields; and a switching network coupled to the plurality of magnetic field sensing elements and configured to connect the plurality of magnetic field sensing elements to form a first bridge circuit having a first arrangement of the magnetic field sensing elements and a second bridge circuit having a second arrangement of the magnetic field sensing elements.

2. The magnetic field sensor of claim 1 wherein:

the plurality of magnetic field sensing elements comprises four magnetic field sensing elements;

the first bridge circuit comprises the four magnetic field sensing elements coupled in the first arrangement; and the second bridge circuit comprises the four magnetic field sensing elements coupled in the second arrangement.

3. The magnetic field sensor of claim 1 wherein the switching network is configured to form the first bridge circuit during a first time period and form the second bridge circuit during a non-overlapping second time period.

4. The magnetic field sensor of claim 1 wherein:

the plurality of magnetic field sensing elements comprises eight magnetic field sensing elements;

the switching network is configured to form the first bridge circuit and the second bridge circuit simultaneously; and the switching network is configured to decouple one or more first magnetic field sensing elements from the first bridge circuit and couple the one or more first magnetic field sensing elements to the second bridge circuit.

5. The magnetic field sensor of claim 4 wherein the switching network is further configured to decouple one or more second magnetic field sensing elements from the second bridge circuit and couple the one or more second magnetic field sensing elements to the first bridge circuit.

6. The magnetic field sensor of claim 4 wherein four of the eight magnetic field sensing elements are positioned on one side of the first and second coils, and another four of the eight magnetic field sensing elements are positioned on an opposite side of the first and second coils.

7. The magnetic field sensor of claim 6 wherein the first and second coils are configured to induce a reflected field from a conductive target.

8. The magnetic field sensor of claim 7 wherein the switching network is configured to form the first bridge circuit and the second bridge circuit so that they are sensitive to differentially sense the reflected field and insensitive to sense the first and second magnetic field.

9. The magnetic field sensor of claim 7 wherein the switching network is configured to form the first bridge circuit and the second bridge circuit so that they are insensitive to sense the reflected field and sensitive to sense the first and second magnetic fields.

10. The magnetic field sensor of claim 1 wherein the switching network is configured to form the first bridge circuit in parallel with the second bridge circuit.

11. The magnetic field sensor of claim 10 wherein the switching network comprises an averaging circuit to average a differential output of the first bridge circuit and a differential output of the second bridge circuit to provide an averaged output signal.

12. The magnetic field sensor of claim 1 further comprising a first signal processing path to process an output signal of the first bridge circuit and a second signal processing path to process an output of the second bridge circuit.

13. The magnetic field sensor of claim 1 wherein the plurality of magnetic field sensing elements comprises one or more of: a Hall effect element, a magnetoresistance element, a giant-magnetoresistance element, and a tunneling magnetoresistance element.

14. The magnetic field sensor of claim 1 wherein the second coil is a counter-coil of the first coil.

15. A magnetic field sensor comprising:

a first coil configured to carry a first current in a first direction to generate a first magnetic field;

a second coil configured to carry a second current in a second, opposite direction to generate a second magnetic field;

a plurality of magnetic field sensing elements configured to detect the first and second magnetic fields; and a switching network coupled to the plurality of magnetic field sensing elements and configured to connect the plurality of magnetic field sensing elements to form a bridge circuit wherein first magnetic field sensing elements of the plurality of magnetic field sensing elements are positioned on one side of the first and second coils and second magnetic field sensing elements of the plurality of magnetic field sensing elements are positioned on an opposite side of the first and second coils and wherein the bridge circuit comprises one or more of the first magnetic field sensing elements and one or more of the second magnetic field sensing elements.

16. The magnetic field sensor of claim 15 wherein the first magnetic field induces a reflected magnetic field in a conductive target and the bridge circuit is configured to detect the reflected field and produce an output signal representing the reflected field, wherein a differential portion of the output signal is responsive to the reflected field.

17. The magnetic field sensor of claim 15 wherein the bridge circuit is configured to produce an output signal representing the second magnetic field, wherein a common mode portion of the output signal is responsive to the second magnetic field.

18. The magnetic field sensor of claim 15 further comprising a signal processing path to process an output signal of the bridge circuit.

19. The magnetic field sensor of claim 15 wherein the plurality of magnetic field sensing elements comprises one or more of: a Hall effect element, a magnetoresistance element, a giant-magnetoresistance element, and a tunneling magnetoresistance element.

* * * * *

UNITED STATES PATENT AND TRADEMARK OFFICE
CERTIFICATE OF CORRECTION

PATENT NO. : 10,917,092 B2  
APPLICATION NO. : 15/947251  
DATED : February 9, 2021  
INVENTOR(S) : Hernán D. Romero Page 1 of 1

It is certified that error appears in the above-identified patent and that said Letters Patent is hereby corrected as shown below:

In the Specification

Column 5, Line 39 delete "between coil" and replace with --between coils--.

Column 5, Line 67 delete "coils 402" and replace with --coil 402--.

Column 7, Line 8 delete "though" and replace with --through--.

Column 7, Line 10 delete "though" and replace with --through--.

Column 7, Line 36 delete "may the" and replace with --may be the--.

Column 8, Line 15 delete "in in the" and replace with --in the--.

Column 10, Line 59 delete "that that" and replace with --that the--.

In the Claims

Column 11, Line 57 delete "field." and replace with --fields.--.

Signed and Sealed this  
First Day of March, 2022

Drew Hirshfeld  
*Performing the Functions and Duties of the  
Under Secretary of Commerce for Intellectual Property and  
Director of the United States Patent and Trademark Office*